(12) United States Patent
Xu

(10) Patent No.: US 10,014,981 B2
(45) Date of Patent: Jul. 3, 2018

(54) TRANSMISSION METHOD AND DEVICE BASED ON MANAGEMENT DATA INPUT/OUTPUT MULTI-SOURCE AGREEMENTS

(71) Applicant: ZTE Corporation, Shenzhen (CN)

(72) Inventor: Yijun Xu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/032,580

(22) PCT Filed: May 29, 2014

(86) PCT No.: PCT/CN2014/078768
§ 371 (c)(1),
(2) Date: Apr. 27, 2016

(87) PCT Pub. No.: WO2014/180414
PCT Pub. Date: Nov. 13, 2014

(65) Prior Publication Data
US 2016/0277151 A1   Sep. 22, 2016

(30) Foreign Application Priority Data
Oct. 29, 2013   (CN) .......................... 2013 1 0522735

(51) Int. Cl.
*H04L 1/00* (2006.01)
*G11C 19/30* (2006.01)

(52) U.S. Cl.
CPC ............ *H04L 1/0083* (2013.01); *G11C 19/30* (2013.01); *H04L 1/009* (2013.01); *H04L 1/0061* (2013.01)

(58) Field of Classification Search
CPC .................................................. H04L 12/2697
(Continued)

(56) References Cited

U.S. PATENT DOCUMENTS 5,719,890 A * 2/1998 Thomman ........... H04L 12/5601
365/189.05
7,376,780 B2   5/2008 Herman
(Continued)

FOREIGN PATENT DOCUMENTS

CN      1996350 A      7/2007
CN    102237983 A     11/2011
(Continued)

OTHER PUBLICATIONS

Supplementary European Search Report in European application No. 14795226.1, dated Oct. 18, 2016.
(Continued)

*Primary Examiner* — Fritz Alphonse
(74) *Attorney, Agent, or Firm* — Oppedahl Patent Law Firm LLC

(57) ABSTRACT

The present invention discloses a transmission method and device based on a management data input/output multi-source agreement. The method includes that: at least one frame is sent, and a host indicates, according to opcodes carried by the at least one frame, to perform a data reading operation or a continuous data reading operation or a data writing operation on an optical module; the at least one frame is used, during checking, for respectively calculating check values at the host and the optical module; it is determined, according to a result of comparison between the check values, whether the check values are correct, and it is decided whether it is needed to repeat the data reading operation or the continuous data reading operation or the data writing operation.

6 Claims, 1 Drawing Sheet

(58) Field of Classification Search
USPC .................................. 714/712, 715, 717, 708
See application file for complete search history.

(56) References Cited

U.S. PATENT DOCUMENTS

| | | |
|---|---|---|
| 8,200,473 B1 | 6/2012 | Dropps |
| 2006/0227811 A1 | 10/2006 | Hussain |
| 2007/0101043 A1 | 5/2007 | Herman |
| 2013/0258842 A1* | 10/2013 | Mizutani ............ H04L 41/0668 |
| | | 370/228 |

FOREIGN PATENT DOCUMENTS

| | | |
|---|---|---|
| CN | 102916776 A | 2/2013 |
| JP | 2008118349 A | 5/2008 |

OTHER PUBLICATIONS

International Search Report in international application No. PCT/CN2014/078768, dated Sep. 11, 2014.

English Translation of the Written Opinion of the International Search Authority in international application No. PCT/CN2014/078768, dated Sep. 11, 2014.

\* cited by examiner

TRANSMISSION METHOD AND DEVICE BASED ON MANAGEMENT DATA INPUT/OUTPUT MULTI-SOURCE AGREEMENTS

TECHNICAL FIELD

The disclosure relates to communications, and in particular to a transmission method and device based on a centum form factor pluggable (CFP) Management Data Input/Output (MDIO) Multi-Source Agreement (MSA).

BACKGROUND

At present, in a data transmission scenario based on a communication protocol, for example, the MDIO MSA, data transmitted during reading and writing operations are not checked instantly. In communications, once an error occurs in data transmission, an inestimable result may be incurred. For example, an error occurs when a wavelength of a channel is set. When it is expected to set the wavelength of the channel as the fourth wave, it is possible to receive at the sixth wave because of interference during the transmission. As a result, there is no signal at the fourth wave after combining the waves, and a superposed signal is at the sixth wave, so that a receiver cannot receive effectively, which causes the service interruption for two signals.

In the process of implementing the technical solutions in the embodiments of the application, the inventor of the application finds at least the following technical problems in the conventional art.

In practical work, because there is not a handshake check mechanism during the MDIO communication, a packet error or packet loss often occurs. However, the host does not know and cannot correct in time.

FIG. 1 shows an MDIO command frame for the MDIO communication. A structure of an MDIO command frame is briefly described as follows.

A data frame structure defined by IEEE 802.3 is used for communications. The whole length of each frame is 64 bits, wherein the first 32 bits are for the preamble, and the last 32 bits are for the address frames or command frames. The 32-bit preamble is continuous 32 logic "1" bits which are sent to the optical module by the host. A state between the frames is idle.

The MDIO command frame is composed of the following 6 parts:
  ST: start bit (2 bit);
  OP: opcode (2 bit);
  PHYADR: physical port address (5 bit), wherein an address value "0b00000" is a broadcast address;
  DEVADD: MDIO device address;
  TA: turn around code (2 bit); for the reading operation, the host and the optical module keep an MDIO data line as high impedance at the first bit of TA, the second bit of TA is set by the optical module as logic "0", and the host starts to send data; for the writing operation, the host sets two bits of driving TA as "0b10", and starts to perform a data writing operation on the optical module; and
  16-bit address or data: a data payload field in the MDIO frame structure.

A communication mode based on the MDIO includes the reading operation, the continuous reading operation and the writing operation.

To sum up, because there is not a check mechanism in communications, a transmission error occurring between the host and the optical module cannot be corrected in time. An effective solution has not been presented with respect to this problem yet.

SUMMARY

In view of the above, the disclosure is intended to provide a transmission method and device based on the CFP MDIO MSA, wherein there is a checking mechanism during communications, which at least solves such a problem that a transmission error occurring between a host and an optical module cannot be corrected in time, thereby improving the reliability of communications.

The technical solutions of the disclosure are implemented as follows.

A transmission method based on a management data input/output multi-source agreement is provided, including that:

at least one frame is sent, and the host indicates to perform a data reading operation or a continuous data reading operation or a data writing operation on the optical module according to opcodes carried by the frame;

the at least one frame is used, during checking, for respectively calculating check values at the host and the optical module; it is determined whether the check values are correct according to a result of comparison between the check values, and it is decided whether it is needed to repeat the data reading operation or the continuous data reading operation or the data writing operation.

Preferably, in the case that the data reading operation is performed, when the opcodes carried by the at least one frame include a first address code, a first register address for the reading operation is indicated; when the opcodes carried by the frame include a first reading opcode, it is indicated to read first register data; the check value is calculated at the optical module according to the read first register address and the first register data;

when the opcodes carried by the at least one frame include a second address code, a second register address for the reading operation is indicated, and the optical module writes the calculated check value in the second register address; when the opcodes carried by the at least one frame include a second reading opcode, it is indicated to read the check value from the second register address; the calculated check value is compared, at the host, with the check value read from the second register address; if the check values are the same, the current flow ends; if the check values are not the same, the transmission is wrong, and it is needed to repeat the data reading operation.

Preferably, in the case that the continuous data reading operation is performed, when the opcodes carried by the at least one frame include an address code, a register address for the continuous reading operation is indicated; when the opcodes carried by the at least one frame include a continuous reading opcode, it is indicated to read register data, and the host continuously reads the register data directly until the opcode in the subsequent frame is not the continuous reading opcode;

the optical module continuously calculates the check value according to the register address and the register data read at each frame while the host continuously reads the register data, and writes the calculated check value into the register address for storing the check values whenever the reading of a frame is completed;

after the continuous reading operation performed by the host ends, the check value is read from the register address for storing the check values, and the calculated check value is compared, at the host, with the check value read from the register address for storing the check values; if the check values are the same, the current flow ends; if the check values are not the same, the transmission is wrong, and it is needed to repeat the continuous data reading operation.

Preferably, in the case that the data writing operation is performed, when the opcodes carried by the at least one frame include the first address code, the first register address for the writing operation is indicated; when the opcodes carried by the frame include a first writing opcode, the first register data required to be written is indicated; the check value is calculated at the optical module according to the first register address and the first register data;

when the opcodes carried by the at least one frame include the second address code, the second register address is indicated, wherein the second register address is the register address in which the check value calculated by the host is stored; when the opcodes carried by the frame include a second writing opcode, it is indicated to write the check value calculated by the host in the second register address; the calculated check value is compared, at the optical module, with the check value read from the second register address; if the check values are the same, the current flow ends; if the check values are not the same, the transmission is wrong, and it is needed to repeat the data writing operation.

A transmission device based on a management data input/output multi-source agreement is also provided, including:

a transmission module, configured to send at least one frame, wherein the host indicates to perform the data reading operation or the continuous data reading operation or the data writing operation on the optical module according to the opcodes carried by the frame; and a check and decision module, configured to, when the at least one frame is used, during checking, for respectively calculating the check values at the host and the optical module, determine whether the check values are correct according to the result of comparison between the check values, and decide whether it is needed to repeat the data reading operation or the continuous data reading operation or the data writing operation.

Preferably, in the case that the data reading operation is performed, the transmission module is further configured to, when the opcodes carried by the frame include the first address code, indicate the first register address for the reading operation, and when the opcodes carried by the frame include the first reading opcode, indicate to read the first register data;

the check and decision module is further configured to calculate, at the optical module, the check value according to the read first register address and first register data;

the transmission module is further configured to, when the opcodes carried by the frame include the second address code, indicate the second register address for the reading operation, and when the opcodes carried by the frame include the second reading opcode, indicate to read the check value in the second register address; and the check and decision module is further configured for the optical module to write the calculated check value in the second register address when indicating the second register address of the reading operation, and configured to compare, at the host, the calculated check value with the check value read from the second register address; if the check values are the same, the current flow ends; if the check values are not the same, the transmission is wrong, and it is needed to repeat the data reading operation.

Preferably, in the case that the continuous data reading operation is performed, the transmission module is further configured to, when the opcodes carried by the at least one frame include the address code, indicate the register address for the continuous reading operation, and when the opcodes carried by the frame include the continuous reading opcode, indicate to read register data;

the check and decision module is further configured for the host to continuously read the register data directly until the opcode of the subsequent frame is not the continuous reading opcode; for the optical module to continuously calculate the check value according to the register address and the register data read at each frame while the host continuously reads the register data, and to write the calculated check value in the register address for storing the check value whenever the reading of a frame is completed; and the check and decision module is further configured to, after the continuous reading operation performed by the host ends, read the check value from the register address for storing the check values, and compare, at the host, the calculated check value with the check value read from the register address for storing the check values; if the check values are the same, the current flow ends; if the check values are not the same, the transmission is wrong, and it is needed to repeat the continuous data reading operation.

Preferably, in the case that the data writing operation is performed, the transmission module is further configured to, when the opcodes carried by the frame include the first address code, indicate the first register address for the writing operation, and when the opcodes carried by the frame include the first writing opcode, indicate the first register data required to be written;

the check and decision module is further configured to indicate the first register data required to be written, and the check value is calculated at the optical module according to the first register address and the first register data;

the transmission module is further configured to, when the opcodes carried by the frame include the second address code, indicate the second register address, wherein the second register address is the register address in which the check value calculated by the host is stored, and when the opcodes carried by the at least one frame include the second writing opcode, indicate to write the check value calculated by the host into the second register address; and the check and decision module is further configured to compare, at the optical module, the calculated check value with the check value read from the second register address; if the check values are the same, the current flow ends; if the check values are not the same, the transmission is wrong, and it is needed to repeat the data writing operation.

The transmission module and the check and decision module can be implemented by a Central Processing Unit (CPU), a Digital Signal Processor (DSP) or a Field-Programmable Gate Array (FPGA) during the execution.

According to the method of the disclosure, at least one frame is sent, and the host indicates to perform the data reading operation or the continuous data reading operation or the data writing operation on the optical module according to the opcodes carried by the frame; the frame is used, during checking, for respectively calculating the check values at the host and the optical module; it is determined whether the check values are correct according to the result of comparison between the check values, and it is decided whether it is needed to repeat the data reading operation or the continuous data reading operation or the data writing operation. According to the method of the disclosure, the existence of the checking mechanism at least solves the problem that the transmission error occurring between the host and the optical module cannot be corrected in time, thereby improving the reliability of communications.

DETAILED DESCRIPTION

The implementation of the technical solutions is further elaborated below in combination with the accompanying drawings.

The method of the disclosure is a transmission check solution adopting the CFP MDIO MSA communication agreement, which can improve the reliability of communications, improve the accuracy and reliability of data transmission, and prevent packet loss and packet error. The present embodiment is implemented by cooperative operation between a host and an optical module. The host, as a sender, sends a frame with control instructions (e.g. the control instructions realized by opcodes) carried, and the optical module, as a receiver, receives the frame and performs corresponding operations according to the read control instructions (e.g. the control instructions realized by the opcodes). And, the frame includes a check frame; the host and the optical module perform a check calculation based on the check frame, namely the same data and the same check algorithm, so that a comparison is performed based on the check values calculated respectively by the host and the optical module. If the check values are the same, the current check operation ends; otherwise, the check operation is continued.

Figure 1:
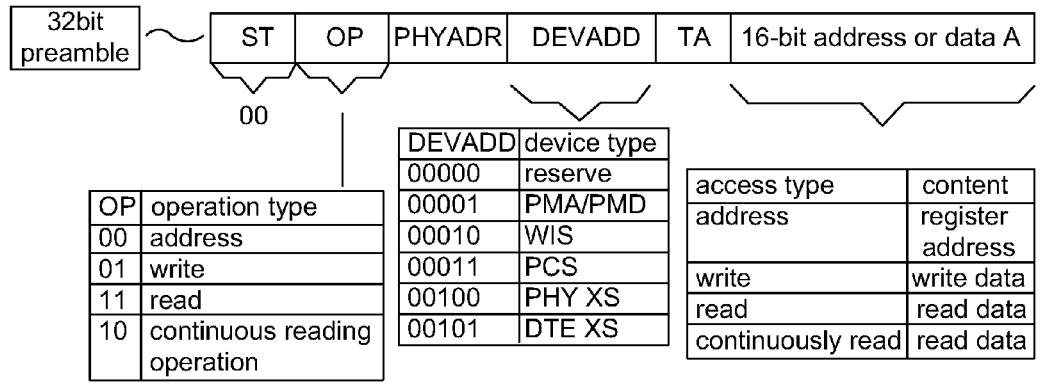
FIG. 1 is a frame structure diagram of the existing MDIO frame.
Figure 2:
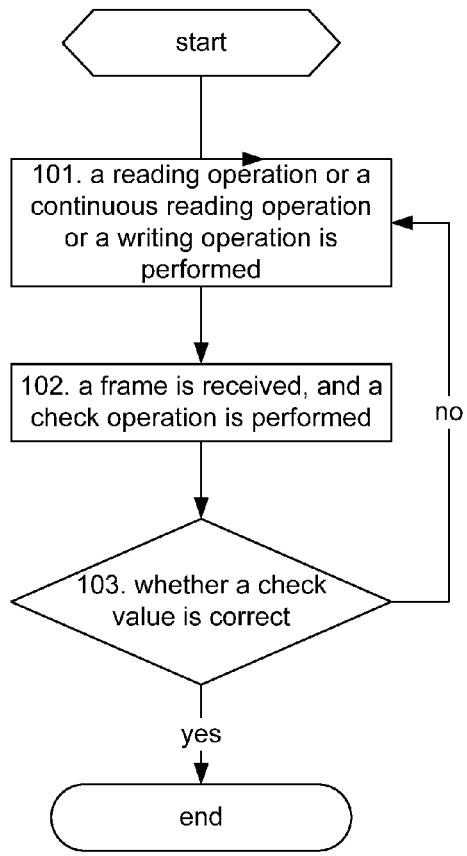
FIG. 2 is a flowchart of a principle of the method according to the disclosure.

Specifically, it is possible to perform address check and data content check with respect to a 16-bit address and data, for example, or only the data content check is performed, or the first two checks are performed on a compete 32-bit frame. After completing a standard reading operation, or a standard writing operation, or a continuous reading operation, a check frame is added, and according to whether the check value is correct, it is decided whether it is needed to repeat the previous operation. As shown in FIG. 2, the flowchart of the reading operation or the writing operation or the continuous reading operation with the check frame added includes the following steps.

At Step 101, the host starts to perform a data reading operation or a continuous data reading operation or a data writing operation on the optical module, and sends the corresponding frame to the optical module.

At Step 102, the corresponding frame is received, and the corresponding operation is performed according to the control instructions realized by the opcodes, wherein the frame is used for performing the check operation during checking.

At Step 103, comparison is performed to determine whether the check values respectively calculated at the host and the optical module match each other. If the check values are the same, it is indicated that the check values are correct, and the current check flow is ended; or else, the check values are not the same, it is indicated that the check values are incorrect, it turns to Step 101, that is, the current data reading operation or the continuous data reading operation or the data writing operation is continued.

Various specific application scenarios of the disclosure are respectively described below.

Application Scenario 1: a Situation of the Data Reading Operation.

The situation of the data reading operation is as follows. The data reading operation with the check frame added is composed of 4 frames, wherein the frames are used for respectively calculating the check values at the host and the optical module to perform the check operation. The host first sends the frames to the optical module. The first two frames are the same as that of the standard reading operation, that is, the opcode OP of the first frame has the address (0b00), which can also be called a first address code for convenient description and distinction. A data payload is a register address for the reading operation, which can also be called a first register address for the reading operation for convenient description and distinction. The opcode OP of the second frame is a reading opcode (0b11), which can also be called a first reading operation code for convenient description and distinction. Then register data is read. The optical module calculates the check value according to the read 16-bit address and data, and writes the calculated check value in a register 83FFh, which can also be called a second register address for the reading operation for convenient description and distinction. At the same time, the host also calculates the check value. The opcode OP of the third frame has the address (0b00), which can also be called a second address code for convenient description and distinction. The data payload is the register address 83FFh, which can also be called a second register address for the reading operation for convenient description and distinction. The opcode OP of the fourth frame is the reading operation code (0b11), which can also be called a second reading operation code for convenient description and distinction. The data of the register 83FFh, namely the check value which is calculated and written into the register 83FFh by the optical module, is read. The host compares the check value calculated herein with the check value of the register 83FFh read by it. If the check values are not the same, it is indicated that the check values are incorrect, the data transmission is wrong, and it is needed to correct. Then, the host performs the data reading operation again.

In practical applications, H refers to the host and M refers to the optical module. Example parameters for the data reading operation are as follows.

Module parameters starting from 9000h can be read and be decomposed into the following contents.

1. Sending the address frame 9000h
the first frame
|   H->M

<Idle><32-bit Preamble><00><00><AAAAA><00001><10><1001 0000 0000 0000><idle>

2. Reading the data of the address 9000h register
the second frame
|   H->M   | |   M->H <Idle><32-bit Preamble><00><11><AAAAA><00001><Z0><DDDD DDDD DDDD DDDD><idle>

3. Sending the address frame of the 83FFh register
the third frame
|   H->M   | |   M->H

```
<Idle><32-bit Preamble><00><00><AAAAA><00001><10><1011
0110 1111 1111><Idle>
4. Reading the data from the address 83FFh register
the fourth frame
|        H->M                    | |         M->H
|
<Idle><32-bit Preamble><00><11><AAAAA><00001><Z0><DDDD
DDDD DDDD DDDD><idle>
this operation ends.
```

Application Scenario 2: a Situation of the Continuous Data Reading Operation.

The situation of the continuous data reading operation is as follows. The continuous reading operation with the check frame added is composed of at least one frame, wherein the at least one frame is used for respectively calculating the check values at the host and the optical module to perform the check operation. The host first sends the at least one frame to the optical module. The first frame is the same as that of the standard reading operation, and the data payload is the register address for the reading operation. The opcode of the second frame is a continuous reading opcode (0b10), wherein the content data is read from the corresponding register and at the same time, the optical module puts the data at the next register address in a buffer for waiting the next frame to be read. At the third frame, the host directly reads the data from the register. The rest can be done in the same manner until the opcode of the frame is not the continuous reading opcode (0b10). The optical module continuously calculates the check value while the host continuously performs the reading operation, and writes the calculated check value in the register 83FFh whenever the reading of a frame is completed. After the continuous reading operation ends, the host reads the check value from the register (the operating mode is same as that of the reading operation), and compares the calculated check value with the read check value. If there is error, the reading operation is repeated.

In practical applications, H refers to the host and M refers to the optical module. The example parameters of the continuous data reading operation are as follows.

Reading the module parameters starting from 8000h can be decomposed into the following contents.

```
1. Sending the address frame 8000h
the first frame
|                                             H->M
|
<Idle><32-bit Preamble><00><00><AAAAA><00001><10><1000
0000 0000 0000><idle>
2. Reading the data from the address 8000h register
the second frame
|        H->M                    | |         M->H
|
<Idle><32-bit Preamble ><00><10><AAAAA><00001><Z0><DDDD
DDDD DDDD DDDD><idle>
3. Reading the data of the address 8001h register
the third frame
|        H->M                    | |         M->H
|
<Idle><32-bit Preamble ><00><10><AAAAA><00001><Z0><DDDD
DDDD DDDD DDDD><idle>
... ...
... ...
4. Reading the data of the address 8000h+n register (the last frame)
the n+1 frame
|        H->M                    | |         M->H
|
<Idle><32-bit Preamble ><00><10><AAAAA><00001><Z0><DDDD
DDDD DDDD DDDD><idle>
5. Sending the address frame of the register 83FFh
the n+2 frame
|        H->M                    | |         M->H
|
<Idle><32-bit Preamble><00><00><AAAAA><00001><10><1011
0110 1111 1111><Idle>
6. Reading the data of the address 83FFh register
the n+3 frame
|        H->M                    | |         M->H
|
<Idle><32-bit Preamble><00><11><AAAAA><00001><Z0><DDDD
DDDD DDDD DDDD><idle>
this operation ends.
```

Application Scenario 3: a Situation of the Data Writing Operation.

The situation of the data writing operation is as follows. The data writing operation with the check frame added is composed of 4 frames, wherein the frame is used for respectively calculating the check values at the host and the optical module to perform the check operation. The host first sends the frames to the optical module. The opcode OP of the first frame is an address, which can also be called the first address code for convenient description and distinction. The data payload is a register address of the optical module, which can also be called the first register address of the writing operation for convenient description and distinction. The opcode OP of the second frame is a writing opcode (0b01), which can also be called a first writing code for convenient description and distinction. The data payload is content to be written in the register. At the same time, the optical module calculates the check values of Cyclic Redundancy Check (CRC)-16 of the two frames. The opcode OP of the third frame is an address, which can also be called the second address code for convenient description and distinction. The data payload is the register address 83FEh where the check value is stored, which can also be the second register address of the writing operation for convenient description and distinction. The opcode OP of the fourth frame is the writing operation, which can also be called a second writing operation code for convenient description and distinction. The data payload is the CRC-16 check values of the first two frames which are calculated by the host. After the 4 frames are sent completely, the writing operation with the check frame added is ended. The optical module compares the check value calculated by it with the check value in the register 83FEh. If there is error, bit 0 of A021h is set as 1, which will cause an alarm. The host can perform the writing operation again according to alarm information. For this, the optical module can also inform the host in other ways.

In practical applications, H refers to the host and M refers to the optical module. The example parameters of the data writing operation are as follows.

An optical sending channel of the CFP optical module is set, and an expected wavelength 0012h (the 18th wave) of the register B400h is set to the sending channel. The calculated CRC-16 check value is put into the register 83FEh, which can be decomposed into the following contents.

```
1. Sending the address frame B400h
the firs frame
|                                             H->M
|
```

-continued

```
<Idle><32-bitPreamble><00><00><AAAAA><00001><10>
<1011010000000000><Idle>
  2. Sending the data frame 0012h
  the second frame
  |                                                    H->M
  |
  <Idle><32-bitPreamble ><00><01><AAAAA><00001><10>
<0000000000010010><Idle>
  3. Sending the address frame 83FEh
  the third frame
  |                                                    H->M
  |
  <Idle><32-bit  Preamble><00><00><AAAAA><00001><10><1011
0110  1111  1110><Idle>
  4. Sending the data frame (the check value of CRC-16 of the data
payload of the first two frames) 8805h
  the fourth frame
  |                                                    H->M
  |
  <Idle><32-bitPreamble><00><01><AAAAA><00001><10><1000
1000  0000  0101><Idle>
  this operation ends.
```

It is noted that there are many algorithms for the check value, which is not limited by the content of this disclosure. In this disclosure, the CRC-16 is adopted. The register address where the check value is stored is not limited to the register address used in this disclosure (the register address 83FEh). Instead, the address can be selected according to the situation.

Figure 3:
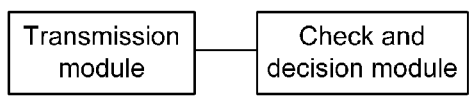
FIG. 3 is a basic structure diagram of the system according to the disclosure.

As shown in FIG. 3, the device of the disclosure includes a transmission module and a check and decision module. The transmission module is mainly configured to transfer the frame between the host and the optical module, namely is configured to send at least one frame. The host indicates to perform the data reading operation or the continuous data reading operation or the data writing operation on the optical module according to the opcodes carried by the at least one frame. The check and decision module is mainly configured to check with respect to the frame at the host and the optical module and decide whether to perform the data reading operation, the continuous data reading operation and the data writing operation again; that is, the check and decision module is configured to, when there is at least one frame and the at least one frame is used, during checking, for respectively calculating the check values at the host and the optical module, determine whether the check value is correct according to the result of comparison between the check values, and decide whether it is needed to repeat the data reading operation or the continuous data reading operation or the data writing operation.

Specifically, the above modules are respectively described in the following three scenarios.

Application Scenario 1: a Situation Where the Data Reading Operation is Performed.

The transmission module is further configured to, when the opcodes carried by the at least one frame include the first address code, indicate the first register address of the reading operation, and when the opcodes carried by the at least one frame include the first reading opcode, indicate to read the first register data.

Correspondingly, the check and decision module is further configured to calculate, at the optical module, the check value according to the read first register address and the first register data.

The transmission module is further configured to, when the opcodes carried by the at least one frame include the second address code, indicate the second register address of the reading operation, and when the opcodes carried by the at least one frame include the second reading opcode, indicate to read the check value in the second register address.

Correspondingly, the check and decision module is further configured for, when indicating the second register address of the reading operation, the optical module to write the calculated check value into the second register address, and to compare, at the host, the calculated check value with the check value read from the second register address; if the check values are the same, to end the current flow; otherwise, to indicate that the transmission is wrong and it is needed to repeat the data reading operation.

Application Scenario 2: a Situation Where the Continuous Data Reading Operation is Performed.

The transmission module is further configured to, when the opcodes carried by the frame include the address code, indicate the register address of the continuous reading operation, and when the opcodes carried by the frame include the continuous reading opcode, indicate to read register data.

Correspondingly, the check and decision module is further configured for the host to continuously read the register data directly until the opcode of the subsequent frame is not the continuous reading opcode; and configured for the optical module to continuously calculate the check value according to the register address and the register data read at each frame while the host continuously reads the register data, and the check and decision module is further configured to write the calculated check value in the register address for storing the check values whenever the reading of a frame is completed.

The check and decision module is further configured to, after the continuous reading operation performed by the host ends, read the register address for storing the check values, and compare, at the host, the calculated check value with the check value read from the register address for storing the check values; if the check values are the same, to end the current flow; or else, to indicate that the transmission is wrong and it is needed to repeat the continuous data reading operation.

Application Scenario 3: a Situation where the Data Writing Operation is Performed.

The transmission module is further configured to, when the opcodes carried by the frame include the first address code, indicate the first register address of the writing operation, and when the opcodes carried by the frame include the first writing opcode, indicate the first register data required to be written in.

Correspondingly, the check and decision module is further configured to indicate the first register data required to be written in, and to calculate the check value at the optical module according to the first register address and the first register data.

The transmission module is further configured to, when the opcodes carried by the frame include the second address code, indicate the second register address, wherein the second register address is the register address in which the check value calculated by the host is stored, and when the opcodes carried by the frame include the second writing opcode, indicate to write the check value calculated by the host in the second register address.

Correspondingly, the check and decision module is further configured to compare, at the optical module, the calculated check value with the check value read from the second register address; if the check values are the same, to end the current flow; or else, to indicate that the transmission is wrong and it is needed to repeat the data writing operation.

To sum up, it can be seen from the above specific description about the three application scenarios that the disclosure has the following advantages.

(1) Operation is simple without change of the structure of the frame, and change of the total processing flow between the host and the optical module. A check frame is added to perform transmission check after the standard reading operation or the standard writing operation of the continuous reading operation is completed; and (2) The correctness and reliability of the data transmission can be ensured by comparing the check values from the host and the optical module and performing the corresponding operation, thereby finding the missing of the transmitted content in time, and finding and correcting the problem in time.

When the integrated modules of the disclosure are implemented in software and sold or used as independent products, they can also be stored in a computer readable storage medium. Based on this understanding, the technical solutions of the disclosure substantially or the part making a contribution to the conventional art can be embodied in the form of software product. The computer software product is stored in a storage medium and includes a number of instructions to make a computer device (which can be a personal computer, a server or a network device, etc.) perform all or part of the method in each of the embodiments of the disclosure. The above storage medium includes: a USB flash disk, a mobile hard disk drive, a Read-Only Memory (ROM), a Random Access Memory (RAM), a magnetic disk or a Compact Disc-ROM (CD-ROM) and other media which can store program codes. Thus, the disclosure is not limited to any specific combination of hardware and software.

Accordingly, the disclosure also provides a computer storage medium which stores computer programs. The computer program is used for performing the transmission method based on the MDIO MSA according to the disclosure.

The above is only the preferred embodiments of the disclosure and not intended to limit the scope of the disclosure.

INDUSTRIAL APPLICABILITY

According to the method of the disclosure, at least one frame is sent, and the host indicates to perform the data reading operation or the continuous data reading operation or the data writing operation on the optical module according to the opcodes carried by the at least one frame; the at least one frame is used, during checking, for respectively calculating the check values at the host and the optical module; it is determined whether the check values are correct according to the result of comparison between the check values, and it is decided whether it is needed to repeat the data reading operation or the continuous data reading operation or the data writing operation. According to the method of the disclosure, the existence of the checking mechanism at least solves the problem that the transmission error occurring between the host and the optical module cannot be corrected in time, thereby improving the reliability of communications.

The invention claimed is:

1. A transmission method based on a Management Data Input/Output Multi-Source Agreement, comprising:
    sending, by a host, at least one frame;
    indicating, by the host, to perform a data reading operation or a continuous data reading operation or a data writing operation on an optical module according to opcodes carried by the at least one frame, wherein the at least one frame is used, during checking, for respectively calculating check values at the host and the optical module;
    determining, by the host, whether the check values are correct according to a result of comparison between the check values; and
    deciding, by the host, whether it is needed to repeat the data reading operation or the continuous data reading operation or the data writing operation,
    wherein in the case that the data reading operation is performed,
    when the opcodes carried by the at least one frame comprise a first address code, indicating a first register address for the data reading operation; when the opcodes carried by the at least one frame comprise a first reading opcode, indicating to read first register data; calculating, at the optical module, a check value according to the read first register address and the first register data;
    when the opcodes carried by the at least one frame comprise a second address code, indicating a second register address for the reading operation, and writing, by the optical module, the calculated check value in the second register address; when the opcodes carried by the at least one frame comprise a second reading opcode, indicating to read the check value from the second register address; comparing, at the host, a check value calculated in the host with the check value read from the second register address; if the check values are the same, ending a current flow; if the check values are not the same, indicating that the transmission is wrong, and it is needed to repeat the data reading operation.

2. A transmission method based on a Management Data Input/Output Multi-Source Agreement, comprising:
    sending, by a host, at least one frame;
    indicating, by the host, to perform a data reading operation or a continuous data reading operation or a data writing operation on an optical module according to opcodes carried by the at least one frame, wherein the at least one frame is used, during checking, for respectively calculating check values at the host and the optical module;
    determining, by the host, whether the check values are correct according to a result of comparison between the check values; and
    deciding, by the host, whether it is needed to repeat the data reading operation or the continuous data reading operation or the data writing operation,
    wherein in the case that the continuous data reading operation is performed,
    when the opcodes carried by the at least one frame comprise an address code, indicating a register address for the continuous reading operation; when the opcodes carried by the at least one frame comprise a continuous reading opcode, indicating to read register data, and continuously reading, by the host, the register data directly until an opcode in a subsequent frame is not the continuous reading opcode;
    continuously calculating, by the optical module, a check value according to the register address and the register data read at each frame while the host continuously reads the register data, and writing the calculated check value into the register address for storing the check values whenever the reading of a frame is completed;

after the continuous reading operation performed by the host ends, reading the check value from the register address for storing the check values, and comparing, at the host, a check value calculated in the host with the check value read from the register address for storing the check values; if the check values are the same, ending a current flow; if the check values are not the same, indicating that the transmission is wrong, and it is needed to repeat the continuous data reading operation.

3. A transmission method based on a Management Data Input/Output Multi-Source Agreement, comprising:

sending, by a host, at least one frame;

indicating, by the host, to perform a data reading operation or a continuous data reading operation or a data writing operation on an optical module according to opcodes carried by the at least one frame, wherein the at least one frame is used, during checking, for respectively calculating check values at the host and the optical module;

determining, by the host, whether the check values are correct according to a result of comparison between the check values; and deciding, by the host, whether it is needed to repeat the data reading operation or the continuous data reading operation or the data writing operation, wherein in the case that the data writing operation is performed, when the opcodes carried by the at least one frame comprise the first address code, indicating a first register address for the writing operation; when the opcodes carried by the at least one frame comprise a first writing opcode, indicating first register data required to be written; calculating, at the optical module, a check value according to the first register address and the first register data;

when the opcodes carried by the at least one frame comprise the second address code, indicating a second register address, wherein the second register address is a register address in which a check value calculated by the host is stored; when the opcodes carried by the at least one frame comprise a second writing opcode, indicating to write the check value calculated by the host in the second register address; comparing, at the optical module, the calculated check value with the check value read from the second register address; if the check values are the same, ending a current flow; if the check values are not the same, indicating that the transmission is wrong, and it is needed to repeat the data writing operation.

4. A transmission device based on a Management Data Input/Output Multi-Source Agreement, comprising:

a processor; and a memory configured to store instructions that, when executed by the processor, cause the processor to:

send at least one frame, wherein a host indicates to perform a data reading operation or a continuous data reading operation or a data writing operation on an optical module according to opcodes carried by the at least one frame; and when the at least one frame is used, during checking, for respectively calculating check values at the host and the optical module, determine whether the check values are correct according to a result of comparison between the check values, and decide whether it is needed to repeat the data reading operation or the continuous data reading operation or the data writing operation, wherein in the case that the data reading operation is performed, the processor is further configured to, when the opcodes carried by the at least one frame comprise a first address code, indicate a first register address for the data reading operation, and when the opcodes carried by the at least one frame comprise a first reading opcode, indicate to read first register data;

the processor is further configured to calculate, at the optical module, a check value according to the read first register address and the first register data;

the processor is further configured to, when the opcodes carried by the at least one frame comprise a second address code, indicate a second register address for the reading operation, and when the opcodes carried by the at least one frame comprise a second reading opcode, indicate to read the check value from the second register address; and the processor is further configured for the optical module to write the calculated check value into the second register address when the second register address for the reading operation is indicated, and configured to compare, at the host, the calculated check value with the check value read from the second register address; if the check values are the same, end a current flow; if the check values are not the same, indicate that the transmission is wrong and it is needed to repeat the data reading operation.

5. A transmission device based on a Management Data Input/Output Multi-Source Agreement, comprising:

a processor; and a memory configured to store instructions that, when executed by the processor, cause the processor to:

send at least one frame, wherein a host indicates to perform a data reading operation or a continuous data reading operation or a data writing operation on an optical module according to opcodes carried by the at least one frame; and when the at least one frame is used, during checking, for respectively calculating check values at the host and the optical module, determine whether the check values are correct according to a result of comparison between the check values, and decide whether it is needed to repeat the data reading operation or the continuous data reading operation or the data writing operation, wherein in the case that the continuous data reading operation is performed, the processor is further configured to, when the opcodes carried by the at least one frame comprise an address code, indicate a register address for the continuous reading operation, and when the opcodes carried by the at least one frame comprise a continuous reading opcode, indicate to read register data;

the processor is further configured for the host to continuously read the register data directly until an opcode of a subsequent frame is not the continuous reading opcode; for the optical module to continuously calculate the check value according to the register address and the register data read at each frame while the host continuously reads the register data, and to write the calculated check value in the register address for storing the check values whenever the reading of a frame is completed; and the processor is further configured to, after the continuous reading operation performed by the host ends, read the check value from the register address for storing the check values, and compare, at the host, the calculated check value with the check value read from the register address for storing the check values; if the check values are the same, end a current flow; if the check values are not the same, indicate that the transmission is wrong, and it is needed to repeat the continuous data reading operation.

6. A transmission device based on a Management Data Input/Output Multi-Source Agreement, comprising:
   a processor; and
   a memory configured to store instructions that, when executed by the processor, cause the processor to:
   send at least one frame, wherein a host indicates to perform a data reading operation or a continuous data reading operation or a data writing operation on an optical module according to opcodes carried by the at least one frame; and
   when the at least one frame is used, during checking, for respectively calculating check values at the host and the optical module, determine whether the check values are correct according to a result of comparison between the check values, and decide whether it is needed to repeat the data reading operation or the continuous data reading operation or the data writing operation,
   wherein in the case that the data writing operation is performed,
   the processor is further configured to, when the opcodes carried by the at least one frame comprise the first address code, indicate a first register address for the writing operation, and when the opcodes carried by the at least one frame comprise a first writing opcode, indicate first register data required to be written;
   the processor is further configured to indicate the first register data required to be written, and calculate, at the optical module, the check values according to the first register address and the first register data;
   the processor is further configured to, when the opcodes carried by the at least one frame comprise a second address code, indicate a second register address, wherein the second register address is a register address in which a check value calculated by the host is stored, and when the opcodes carried by the at least one frame comprise a second writing opcode, indicate to write the check value calculated by the host into the second register address; and
   the processor is further configured to compare, at the optical module, the calculated check value with the check value read from the second register address; if the check values are the same, end a current flow; if the check values are not the same, indicate that the transmission is wrong and it is needed to repeat the data writing operation.

* * * * *